(12) United States Patent
Peng et al.

(10) Patent No.: US 8,456,860 B2
(45) Date of Patent: Jun. 4, 2013

(54) ELECTRONIC DEVICE HAVING INNER HOLDER FOR FUNCTIONAL MODULE

(75) Inventors: Wen-Tang Peng, New Taipei (TW); Xin-Hu Gong, Shenzhen (CN); Gao-Liang Xia, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 161 days.

(21) Appl. No.: 13/104,007

(22) Filed: May 9, 2011

(65) Prior Publication Data

US 2012/0155050 A1    Jun. 21, 2012

(30) Foreign Application Priority Data

Dec. 20, 2010   (CN) .......................... 2010 1 0596744

(51) Int. Cl.
*H05K 7/02* (2006.01)
(52) U.S. Cl.
USPC ...... 361/807; 361/727; 361/724; 248/220.21; 248/27.3; 248/346.04; 312/223.2; 312/249.4
(58) Field of Classification Search
USPC ............. 312/348.5, 348.3, 122, 249.4, 249.9, 312/249.11, 310; 248/220.21
See application file for complete search history.

(56) References Cited

U.S. PATENT DOCUMENTS

| | | | | |
|---|---|---|---|---|
| 1,425,559 A * | 8/1922 | Wampach et al. | ......... | 312/348.5 |
| 6,726,164 B1 * | 4/2004 | Baiza et al. | ............. | 248/222.12 |
| 6,807,054 B1 * | 10/2004 | Waller et al. | ............. | 361/679.09 |
| 7,019,963 B2 * | 3/2006 | Lee et al. | ................. | 361/679.06 |
| 7,473,846 B2 * | 1/2009 | Doerr et al. | ...................... | 174/69 |
| 7,628,461 B2 * | 12/2009 | Carden et al. | ................. | 312/402 |
| 7,742,308 B1 * | 6/2010 | King et al. | ..................... | 361/727 |
| 7,780,385 B2 * | 8/2010 | Brierton | ........................ | 410/129 |
| 2004/0184243 A1 * | 9/2004 | Mease et al. | .................... | 361/725 |
| 2005/0145582 A1 * | 7/2005 | Dubon et al. | .................... | 211/26 |
| 2005/0257232 A1 * | 11/2005 | Hidaka | ......................... | 720/654 |
| 2008/0030946 A1 * | 2/2008 | Lee | ................................ | 361/685 |
| 2008/0062635 A1 * | 3/2008 | Chang | ........................... | 361/685 |
| 2008/0108245 A1 * | 5/2008 | Chu et al. | ...................... | 439/374 |
| 2008/0204982 A1 * | 8/2008 | Wu et al. | ....................... | 361/680 |

(Continued)

OTHER PUBLICATIONS

Chun Ye Car Accessories, "Car Trash Bin", <http://www.steering-cover.com/car-trash-bin.htm>.*
Chun Ye Car Accessories, "Car Trash Bin", <http://www.steering-cover.com/car-trash-bin.htm>, Dec. 6, 2012.*

*Primary Examiner* — Adrian S Wilson
*Assistant Examiner* — Abhishek Rathod
(74) *Attorney, Agent, or Firm* — Altis Law Group, Inc.

(57) ABSTRACT

An exemplary electronic device includes a housing, a left rail and a right rail assembled in the housing, and a holder assembled on the left and right rails and received in the housing. The holder can slide out from the housing for securing a functional module thereon. The holder includes a bottom plate glidingly assembled on the left and right rails, and front and rear plates both pivotally secured on the bottom plate. The front and rear plates are both elastically biased to rotate about the bottom plate. When the holder is at least partially received in the housing, the front and rear plates are in original closed positions. When the holder is almost totally slid out from the housing, the front and rear plates rotate about the bottom plate to be in open positions for providing resilience to secure the functional module.

20 Claims, 13 Drawing Sheets

U.S. PATENT DOCUMENTS

| | | | |
|---|---|---|---|
| 2008/0239689 A1* | 10/2008 | Okamoto et al. | 361/807 |
| 2008/0244052 A1* | 10/2008 | Bradicich et al. | 709/223 |
| 2008/0298007 A1* | 12/2008 | Chen | 361/685 |
| 2010/0265645 A1* | 10/2010 | Wang et al. | 361/679.4 |
| 2010/0265651 A1* | 10/2010 | Huang et al. | 361/679.39 |
| 2010/0277861 A1* | 11/2010 | Roesner et al. | 361/679.33 |
| 2011/0090633 A1* | 4/2011 | Rabinovitz | 361/679.31 |
| 2011/0248612 A1* | 10/2011 | Peng et al. | 312/326 |

* cited by examiner

ELECTRONIC DEVICE HAVING INNER HOLDER FOR FUNCTIONAL MODULE

BACKGROUND

1. Technical Field

The present disclosure relates generally to electronic devices, and more particularly to an electronic device having an inner holder for securing a functional module on the electronic device when needed.

2. Description of Related Art

Nowadays electronic devices such as servers include a plurality of functional modules, such as DVD (digital video disk) drives, to expand the operations that the electronic device can perform. However, these functional modules may or may not be used frequently. If the functional modules are permanently installed in an electronic device, the cost of the electronic device is increased, and the electronic device may be uncompetitive in the marketplace. Therefore, typically, the functional modules are installed in an electronic device by way of plug-and-play. This means the functional modules are installed in the electronic device when required, and detached from the electronic device when not required. However, the functional modules may be large and difficult to secure in the electronic device.

What is needed, therefore, is an electronic device for conveniently securing functional modules therein.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 1:
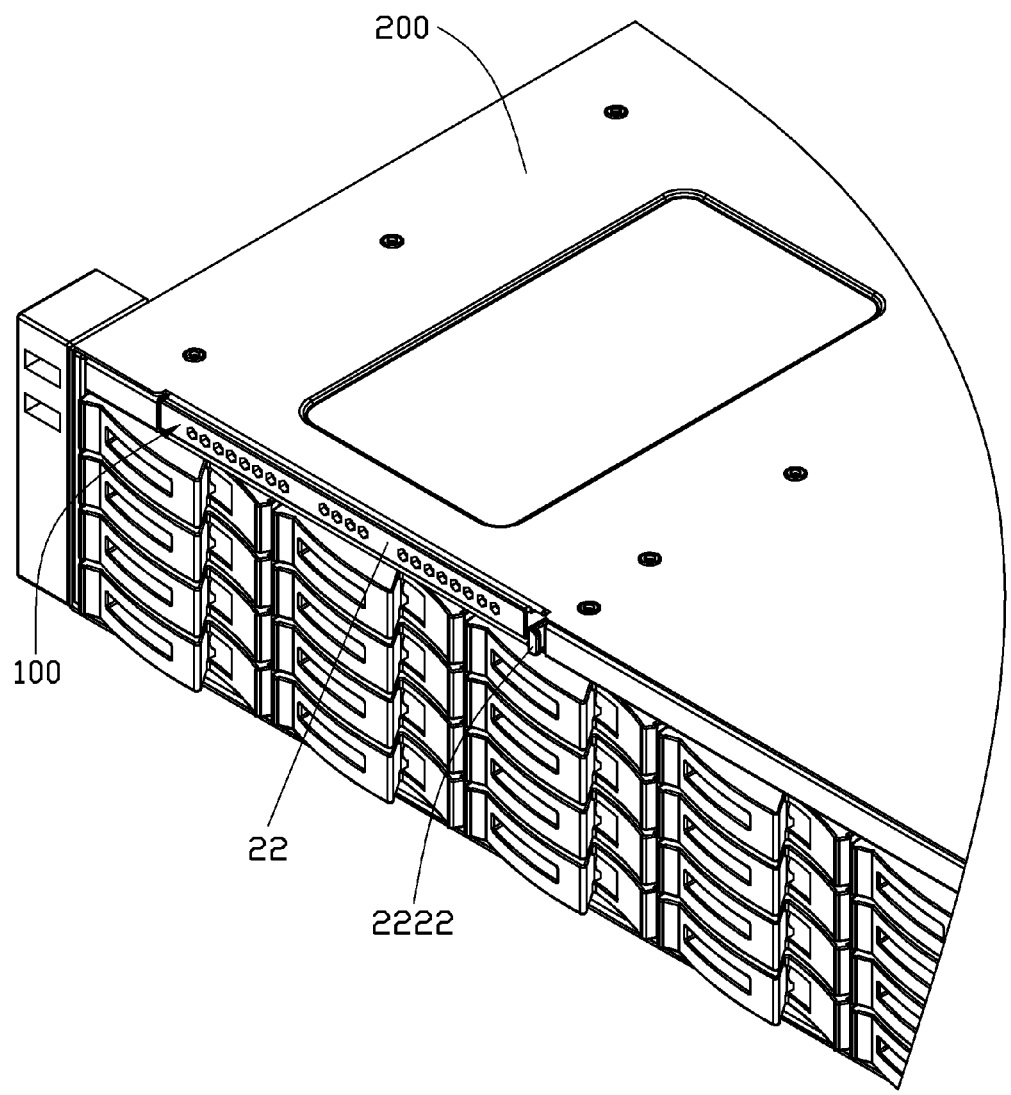
FIG. 1 is an isometric, assembled view of part of an electronic device in accordance with an embodiment of the present disclosure, wherein a holder of the electronic device is totally received in the electronic device.
Figure 13:
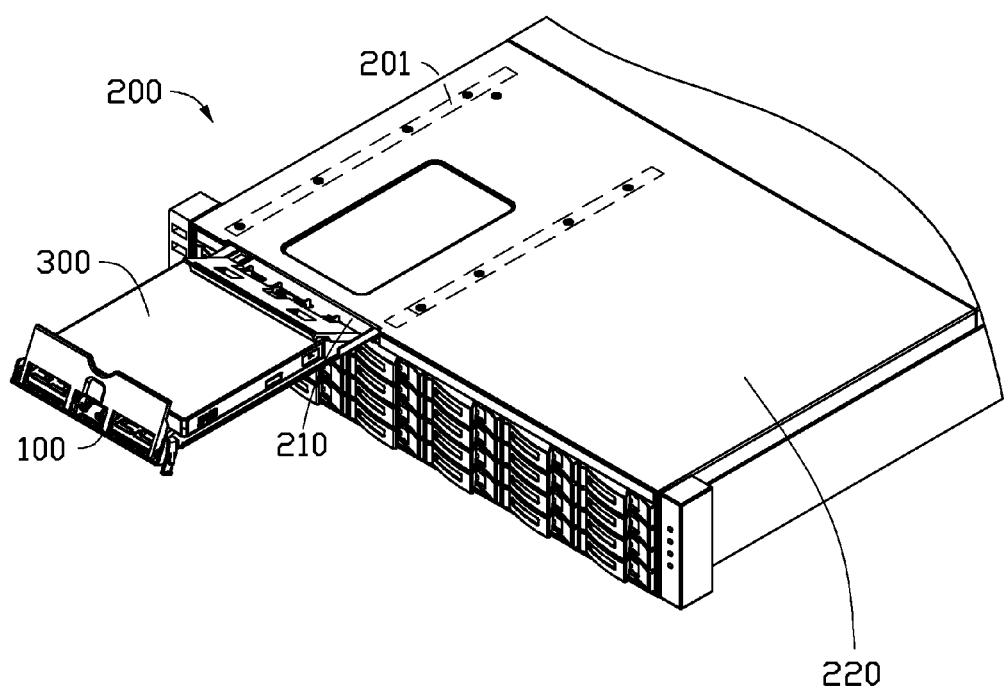
FIG. 13 is an isometric, assembled view of the electronic device of FIG. 1, wherein the holder of FIG. 11 is almost totally slid out from the electronic device and the functional module of FIG. 11 is secured on the holder.

Referring to FIGS. 1 and 13, an electronic device 200 in accordance with an exemplary embodiment is shown. The electronic device 200 can be for example a server. The electronic device 200 comprises a housing 220 defining a receiving space 210 therein. A pair of rails 201 is formed in the electronic device 200. A holder 100 is assembled onto the rails 201, and is capable of sliding along the rails 201. In FIG. 1, the holder 100 is totally received in the electronic device 200. In FIG. 13, the holder 100 is slid almost totally outside of the electronic device 200, and a functional module 300, such as a DVD drive, is secured on the holder 100.

Figure 2:
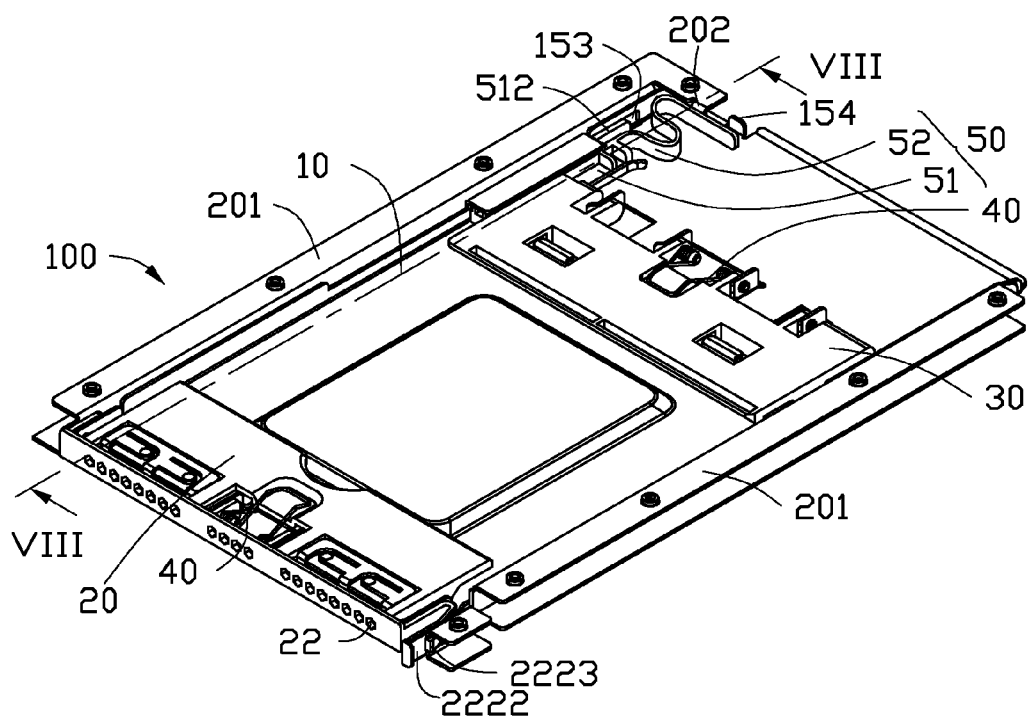
FIG. 2 is an isometric, assembled view of the holder of FIG. 1, wherein the holder is assembled onto two rails of the electronic device.
Figure 3:
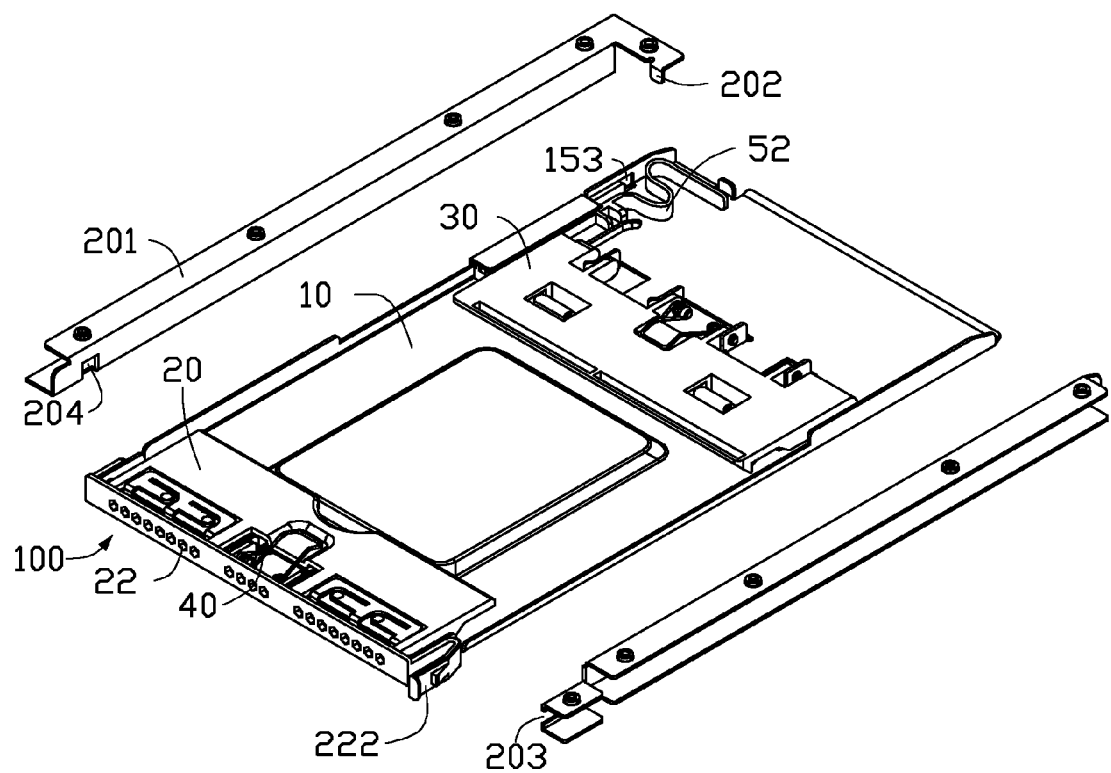
FIG. 3 is an exploded view of the holder and the rails of FIG. 2.

Also referring to FIGS. 2 and 3, the holder 100 comprises a bottom plate 10, a front plate 20 pivotally connected to a front end of the bottom plate 10, a rear plate 30 pivotally connected to a rear portion of the bottom plate 10, two torsion springs 40 secured on the front and rear plates 10, 30, respectively, and providing resilience for the front and rear plates 10, 30, and an actuator 50 mounted on the bottom plate 10 for automatically rotating the rear plate 30 when the holder 100 is pulled almost totally outside of the electronic device 200. As shown in FIG. 2, when the holder 100 is received in the housing 220 of the electronic device 200, the actuator 50 resiliently abuts against a first baffle tab 202 extending from a rear end of one of the rails 201 (hereinafter referred to as the left rail 201). As shown in FIG. 3, a restricting opening 204 is defined in the left rail 201 near a front end thereof, and a notch 203 is defined in a front end of the other rail 201 (hereinafter referred to as the right rail 201).

Figure 6:
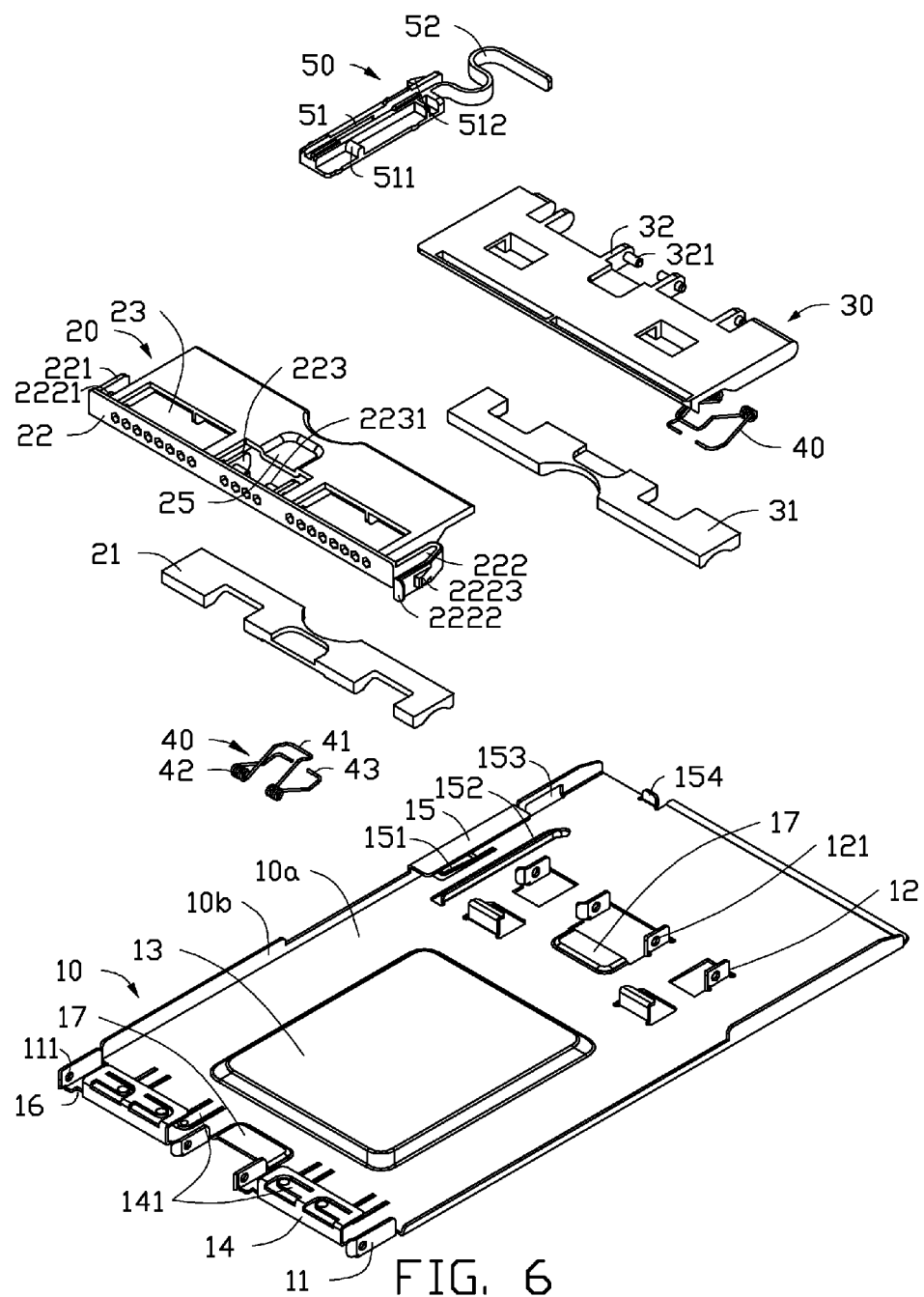
FIG. 6 is an exploded view of the holder of FIG. 2.
Figure 7:
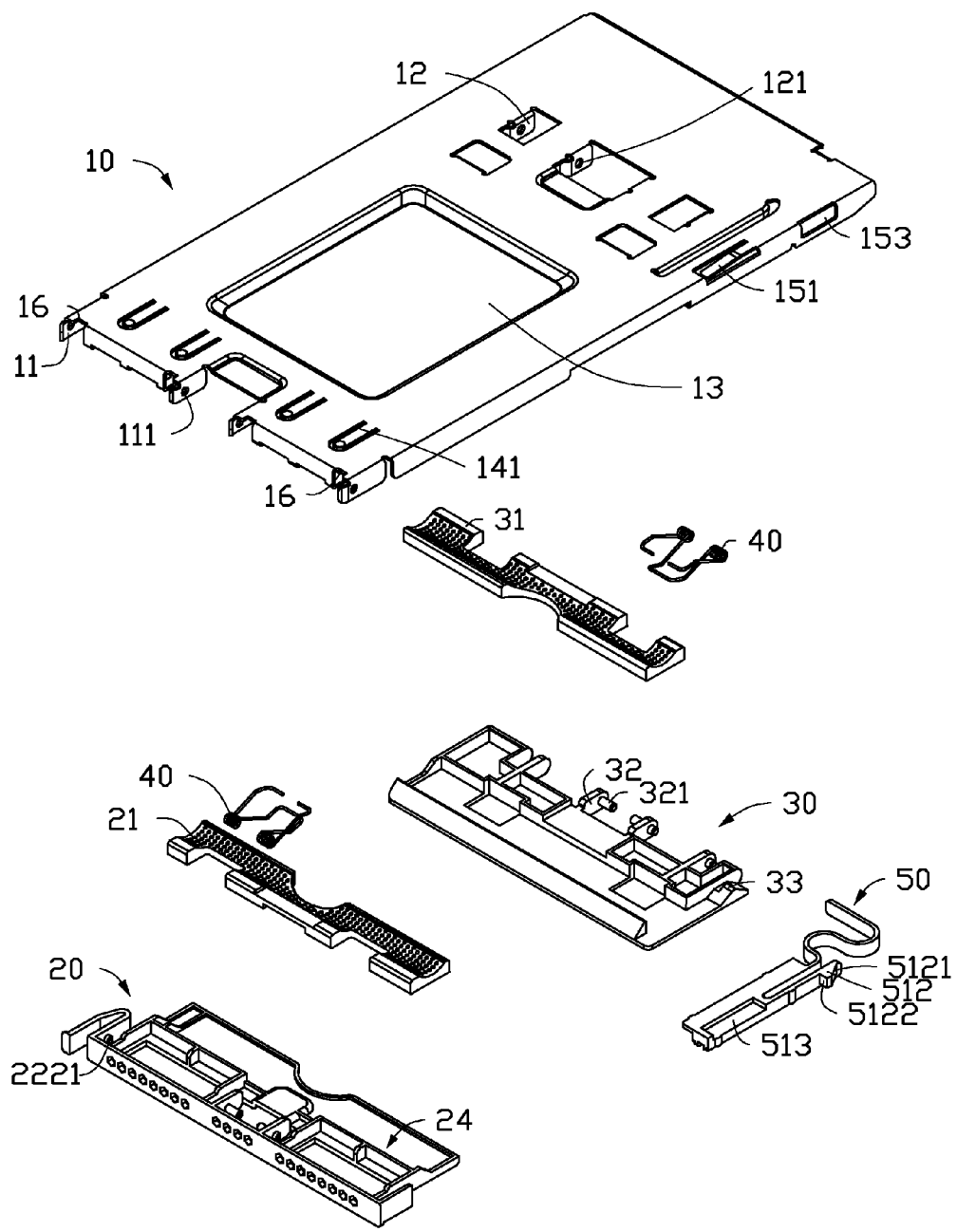
FIG. 7 is a view of the holder of FIG. 6, but showing the parts of the holder inverted.

Referring also to FIGS. 6 and 7, the bottom plate 10 is substantially rectangular in shape. The bottom plate 10 comprises a main body 10a, and two flanges 10b extending upwardly from two lateral sides of the main body 10a, respectively. Four front connecting plates 11 are formed on a front end of the main body 10a (i.e., at the front end of the bottom plate 10). The front connecting plates 11 are parallel to and spaced from each other. A hole 111 is defined in each of the front connecting plates 11. The holes 111 are used for connecting the bottom plate 10 with the front plate 20. It is understood that the number of front connecting plates 11 is not limited in the present disclosure. Two outermost of the front connecting plates 11 are approximately aligned with the two flanges 10b, respectively.

Two ears 14 are bent upwardly from the front end of the main body 10a. One of the ears 14 is positioned between a left outermost one of the front connecting plates 11 and an adjacent inner front connecting plate 11. The other ear 14 is positioned between a right outermost one of the front connecting plates 11 and an adjacent inner front connecting plate 11. A plurality of elastically deformable spring fingers 141 are formed on the ears 14 and on a front portion of the main body 10a, for resiliently contacting the electronic device 200 both mechanically and electrically and thereby suppressing electromagnetic interference. Four cutouts 16 are defined in the front end of the main body 10a, one at each of opposite left and right sides of each ear 14. The cutouts 16 serve to both allow rotation of the front plate 20 and limit an extent of the rotation of the front plate 20. A bottom plate protrusion 17 protrudes upwardly from a middle portion of the front end of the main body 10a, and is positioned between the two inner front connecting plates 11. The bottom plate protrusion 17 is used for engaging with one of the torsion springs 40.

Four rear connecting plates 12 are formed on a rear portion of the main body 10a (i.e., at the rear portion of the bottom plate 10). The rear connecting plates 12 are parallel to and spaced from each other. A hole 121 is defined in each of the rear connecting plates 12, and the holes 121 are used for connecting the bottom plate 10 with the rear plate 30. Another bottom plate protrusion 17 is formed between two inner ones of the rear connecting plates 12, and is used for engaging with the other torsion spring 40. A horizontal positioning plate 15 extends horizontally and inward from a top of one of the flanges 10b which is adjacent to the left rail 201 (hereinafter referred to as the left flange 10b), towards the rear connecting plates 12. An elastic plate 151 extends up slantwise from the main body 10a. The elastic plate 151 is positioned below the horizontal positioning plate 15. The elastic plate 151 gradually extends upwardly along a direction from a rear end of the main body 10a to the front end of the main body 10a.

A vertical positioning plate 152 extends up from the main body 10a, and is positioned between the elastic plate 151 and a nearest outermost one of the rear connecting plates 12. Considered overall, the vertical positioning plate 152 extends along the direction from the rear end to the front end of the main body 10a. The vertical positioning plate 152 is thus substantially perpendicular to the horizontal positioning plate 15, and parallel to the direction of extension of the elastic plate 151. In the present embodiment, the vertical positioning plate 152 is integrally formed with the main body 10a by punching. A longitudinal groove 153 is defined in a rear of the left flange 10b. The groove 153 is positioned behind the horizontal positioning plate 15. A second baffle tab 154 extends upwardly from the rear end of the main body 10a. The second baffle tab 154 is substantially aligned with the vertical positioning plate 152. The horizontal positioning plate 15, the elastic plate 151, the vertical positioning plate 152, the groove 153 and the second baffle tab 154 cooperate to define a receiving room for the actuator 50 to be engagingly received therein.

A rectangular platform 13 protrudes upwardly from a middle portion of the main body 10a, and is positioned between the front connecting plates 11 and the rear connecting plates 12. The platform 13 is held in contact with the functional module 300 when the functional module 300 is received in the holder 100, for increasing a stability of the functional module 300. The platform 13 can also serve to increase a strength of the holder 100.

The bottom plate 10 can be formed of sheet metal by stamping/punching, which is very suitable for mass production.

The front plate 20 is pivotally connected to the front connecting plates 11. A rubber front shim 21 is attached to a bottom surface 24 of the front plate 20.

The front plate 20 is substantially rectangular in shape. A long plate portion is positioned at a front end of the front plate 20, and can serve as a door 22 of the holder 100. The door 22 is exposed at an outside of the electronic device 200, as shown in FIG. 1. Returning also to FIGS. 6 and 7, a lateral connecting plate 221 and a U-shaped clasp 222 extend rearwards from two opposite ends of the door 22, respectively. The lateral connecting plate 221 and the U-shaped clasp 222 are positioned corresponding to the two outermost front connecting plates 11 of the bottom plate 10, respectively. Two first pivot pins 2221 extend inward from the lateral connecting plate 221 and the U-shaped clasp 222, respectively. Two inner connecting plates 223 extend rearwards from a middle portion of the door 22, and are positioned corresponding to the two inner front connecting plates 11 of the bottom plate 10, respectively. The inner connecting plates 223 each have two second pivot pins 2231 extending from two opposite sides thereof, respectively. One of the first pivot pins 2221 and the corresponding second pivot pin 2231 extending toward that first pivot pin 2221 are inserted through the holes 111 of the corresponding front connecting plates 11. The other first pivot pin 2221 and the corresponding second pivot pin 2231 extending toward that first pivot pin 2221 are inserted through the holes 111 of the corresponding front connecting plates 11. Thereby, pivotal connection of the front plate 20 to the bottom plate 10 is obtained.

Figure 4:
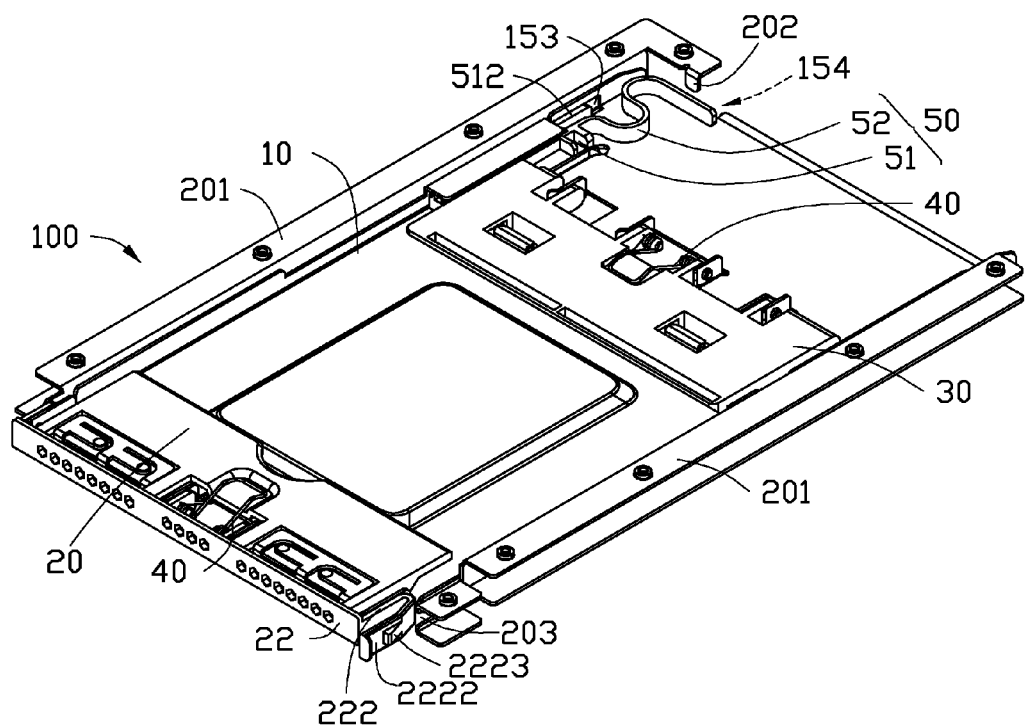
FIG. 4 is similar to FIG. 2, but showing the holder partly slid outward along the rails.

The U-shaped clasp 222 has a handle 2222 positioned at an outside distal end thereof. A catch 2223 is formed on the U-shaped clasp 222 behind the handle 2222. The catch 2223 is engagingly received in the notch 203 of the right rail 201 to thereby secure the holder 100 in the electronic device 200, as shown in FIGS. 1 and 2. Referring also to FIG. 4, after pressing the handle 2222, the catch 2223 can be disengaged from the notch 203, and the holder 100 can be slid along the rails 201 and pulled partially out from the electronic device 200.

The front plate 20 defines two receiving spaces 23 behind the door 22. The receiving spaces 23 are aligned with each other along a widthwise direction of the front plate 20. The receiving spaces 23 are used for receiving the ears 14 of the bottom plate 10 when the holder 100 is received in the electronic device 200. In FIG. 2, the front plate 20 is shown in its original closed position substantially parallel to the bottom plate 10. A top plate protrusion 25 protrudes downwardly from a middle portion of the front plate 20. The top plate protrusion 25 is used for engaging with one of the torsion springs 40. A plurality of concavities (not labeled) are defined in the bottom surface 24 of the front plate 20 for reducing the weight of the front plate 20. The front shim 21 can be attached to the bottom surface 24 of the front plate 20 by adhesive (glue) and the like. At least part of the front shim 21 is received in the concavities of the front plate 20.

The front plate 20 and the rear plate 30 are both elastically biased by the torsion springs 40 to rotate about the bottom plate 10 toward their original positions substantially parallel to the bottom plate 10.

Figure 5:
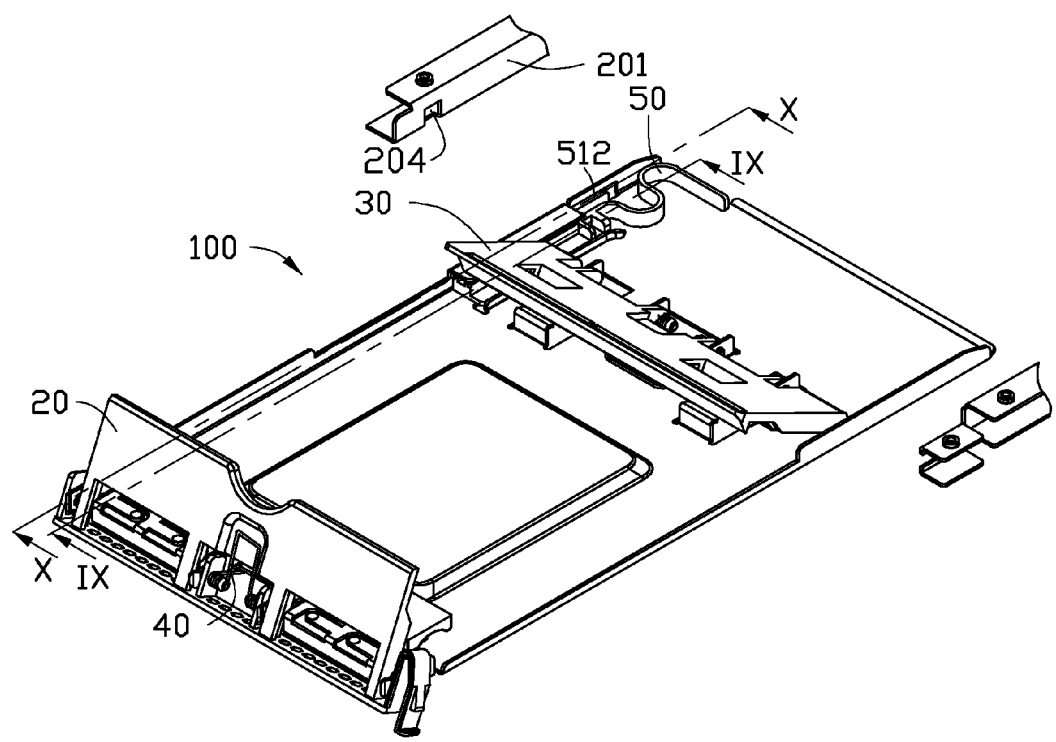
FIG. 5 is similar to FIG. 4, but schematically showing the holder almost totally slid out from the rails, and a front plate and a rear plate of the holder rotated to a certain extent to be in open positions.
Figure 11:
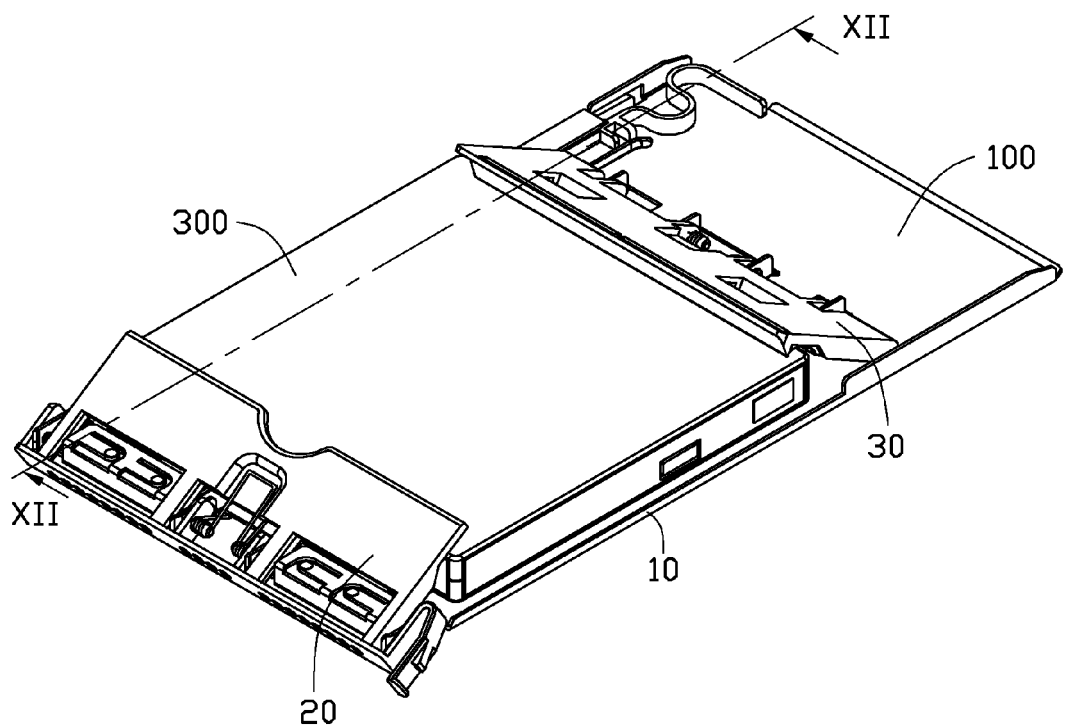
FIG. 11 is similar to FIG. 5, but showing a functional module secured on the holder by the front and rear plates.
Figure 12:
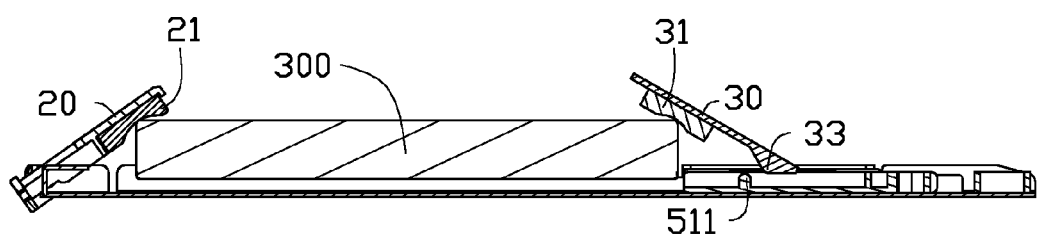
FIG. 12 is a cross sectional view of the holder and the functional module of FIG. 11, taken along line XII-XII thereof.

The torsion springs 40 each comprise a top arm 41, a pair of bottom arms 43, and a pair of coiled pivot portions 42 interconnecting the top and bottom arms 41, 43, respectively. As to the torsion spring 40 fixed to the front plate 20, the pivot portions 42 are coiled on portions of the second pivot pins 2231 of the inner connecting plates 223 which extend toward each other, the top arm 41 is engaged with the top plate protrusion 25 of the front plate 20, and the bottom arm 43 is engaged with the bottom plate protrusion 17 of the bottom plate 10. Resilience provided by the torsion spring 40 can keep the front plate 20 on the bottom plate 10 at the original position as shown in FIG. 2. When a force is exerted on the front plate 20, the front plate 20 can rotate about the bottom plate 10 (i.e., rotate about the first and second pivot pins 2221, 2231) to be in an open position as shown in FIG. 5. When the front plate 20 and the rear plate 30 are both in the open position, the functional module 300 can be secured on the bottom plate 10, as shown in FIGS. 11-13.

A rubber rear shim 31 is attached to a bottom surface of the rear plate 30. The structure of the rear plate 30 is substantially similar to the front plate 20. In particular, the rear plate 30 comprises similar characteristics such as rear connecting plates 32 and third pivot pins 321. The pivotal connection between the bottom plate 10, the rear plate 30 and the corresponding torsion spring 40 is similar to that of the bottom plate 10, the front plate 20 and the corresponding torsion spring 40. Thus, a detailed description of the similar structure of the rear plate 30 and the relationship between the rear plate 30 and the bottom plate 10 is omitted from this description for brevity.

A difference between the rear plate 30 and the front plate 20 is that a knuckle 33 is formed on a lateral side of the bottom surface of the rear plate 30. In this embodiment, a profile of the knuckle 33 is generally in the form of an inverted ridge. In particular, the knuckle 33 comprises two sloped sides (i.e. a front side and a rear side) joined by a curved (rounded) bottom. The knuckle 33 contacts the actuator 50 to accomplish rotating of the rear plate 30 when the holder 100 is slid partially outside from the electronic device 200 (this is described in more detail hereinafter).

The actuator 50 is engagingly received in the receiving room defined by the horizontal positioning plate 15, the elastic plate 151, the vertical positioning plate 152, the groove 153 and the second baffle tab 154 of the bottom plate 10. The actuator 50 comprises a slide portion 51, and an elastic portion 52 extending from a rear end of the slide portion 51. The elastic portion 52 is an S-shaped bent resilient plate. It is noted that the elastic portion 52 can instead be a spring or another kind of elastic member in alternative embodiments. A hook 512 extends from the rear end of the slide portion 51, but is spaced from the elastic portion 52. The hook 512 has an oblique guiding surface 5121 at an outer lateral side thereof, and a stopping surface 5122 at a front thereof.

As shown in FIG. 2, when the holder 100 is totally received in the electronic device 200, the hook 512 is received in the groove 153 and resiliently abuts against the left rail 201, the stopping surface 5122 of the hook 512 abuts against an edge of the left flange 10b that bounds a front extremity of the groove 153, and the free end of the elastic portion 52 resiliently abuts against the first baffle tab 202 of the left rail 201.

Referring to FIGS. 4-6, when the holder 100 is partially or almost totally slid out from the electronic device 200, the free end of the elastic portion 52 resiliently abuts against the second baffle tab 154 of the bottom plate 10. The hook 512 remains in pressing engagement against the left rail 201 when the holder 100 remains mostly or partially received in the electronic device 200. However, the hook 512 can release its resilience and engage in the restricting opening 204 of the left rail 201 when the holder 100 is slid almost completely out from the electronic device 200. When the hook 512 is engaged in the restricting opening 204, the stopping surface 5122 of the hook 512 abuts against an edge of the left rail 201 that bounds a front extremity of the restricting opening 204. If the holder 100 is continued to be (manually) pulled outward along the rails 201, the hook 512 moves backwards relative to left flange 10b and accordingly backwards in the groove 153, the stopping surface 5122 of the hook 512 separates from the edge of the flange 10b that bounds the front extremity of the groove 153, the slide portion 51 moves backwards relative to the bottom plate 10, and the elastic portion 52 is further compressed in its position abutting against the second baffle tab 154 of the bottom plate 10. Thus, if the holder 100 is continued to be pulled outward along the rails 201 in this way, the combination of the actuator 50 and the bottom plate 10 progressively resists such outward movement and prevents excessive further outward movement from occurring.

Figure 8:
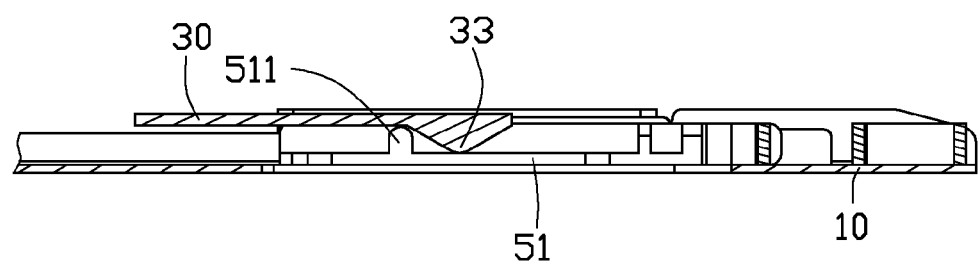
FIG. 8 is a cross sectional view of part of the holder of FIG. 2, taken along line VIII-VIII thereof.
Figure 10:
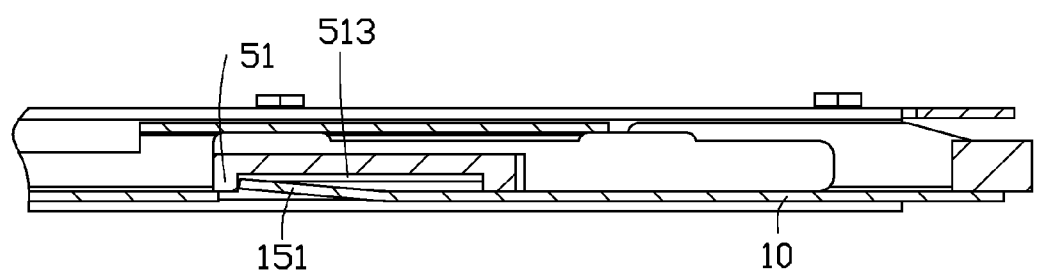
FIG. 10 is another cross sectional view of part of the holder of FIG. 5, taken along line X-X thereof.

A stopping wall 511 extends upwardly from a top surface of the slide portion 51. As shown in FIG. 8, when the rear plate 30 is in the original closed position substantially parallel to the bottom plate 10, the stopping wall 511 stands immediately in front of the knuckle 33 of the rear plate 30. As shown in FIG. 7, a recess 513 is defined in a bottom surface of the slide portion 51. The elastic plate 151 of the bottom plate 10 is received in the recess 513, and can abut against an edge of the slide portion 51 that bounds a front extremity of the recess 513 to prevent backwards movement of the slide portion 51 relative to the bottom plate 10, as shown in FIG. 10 (this is described in more detail hereinafter).

Further referring to FIGS. 2 and 3, the U-shaped clasp 222 of the door 22 engages with the right rail 201 to secure the holder 100 in the electronic device 200. Specifically, the catch 2223 of the U-shaped clasp 222 is engagingly received in the notch 203 of the right rail 201. At this state, the front and rear plates 20, 30 are both in their original closed positions, which are substantially parallel to the bottom plate 10. The stopping surface 5122 of the hook 512 of the actuator 50 abuts against the edge of the left flange 10b that bounds the front extremity of the groove 153. The elastic portion 52 of the actuator 50 resiliently abuts against the first baffle tab 202 of the left rail 201. The hook 512 of the actuator 50 resiliently abuts against the left rail 201. The first baffle tab 202 is located forward of the second baffle tab 154 of the bottom plate 10, but is not aligned with the second baffle tab 154 along a widthwise direction of the bottom plate 10. With the first and second baffle tabs 202, 154 spaced from each other in this way, the second baffle tab 154 does not interfere with the first baffle tab 202 when the second baffle tab 154 is moved forward relative to the first baffle tab 202.

Referring to FIG. 4, when the holder 100 needs to be pulled out from the electronic device 200, the handle 2222 of the U-shaped clasp 222 is pressed towards the door 22 by a user, to make the catch 2223 of the U-shaped clasp 222 disengage from the notch 203 of the right rail 201. The holder 100 is ejected out from the electronic device 200 a certain distance due to partial resilient rebounding of the elastic portion 52, with the hook 512 pushing the edge of the left rail 201 that bounds the front extremity of the groove 153 until the elastic portion 52 resiliently abuts against the second baffle tab 154 of the bottom plate 10 (the second baffle tab 154 is invisible in FIG. 4 due to shielding of the elastic portion 52). The distance by which the holder 100 is ejected automatically is the distance between the first baffle tab 202 of the left rail 201 and the second baffle tab 154 of the bottom plate 10 in a front-to-back direction of the holder 100, as seen in FIG. 2. Also referring to FIG. 8, when the holder 100 is in the ejected position, the stopping wall 511 of the slide portion 51 is located immediately adjacent to a front side of the knuckle 33 of the rear plate 30. After the above-described initial automatic ejection, the holder 100 can be further pulled out from the electronic device 200 manually, to a desired position.

Figure 9:
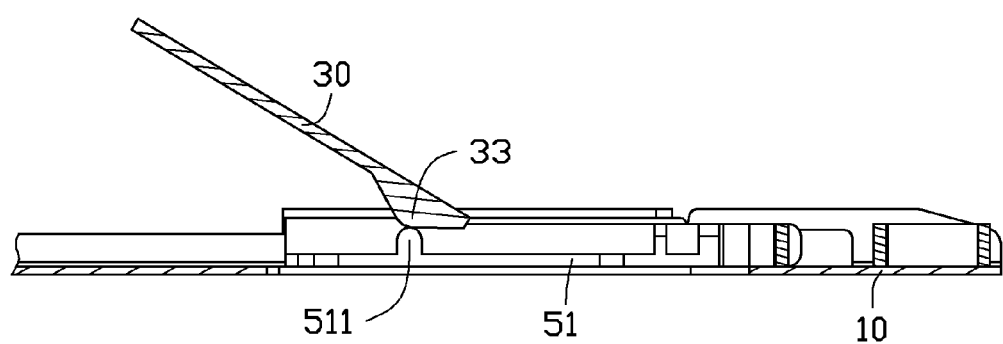
FIG. 9 is a cross sectional view of part of the holder of FIG. 5, taken along line IX-IX thereof.

The hook 512 of the actuator 50 remains in resilient abutment against the left rail 201 during the above-described automatic forward movement and manual movement of the holder 100 along the rails 201 in the electronic device 200. When the hook 512 reaches the restricting opening 204 of the left rail 201, the hook 512 resiliently rebounds and engages in the restricting opening 204, and the stopping surface 5122 of the hook 512 abuts against the edge of the left rail 201 that bounds the front extremity of the restricting opening 204. After that moment, the stopping surface 5122 starts to separate from the edge of the left flange 10b that bounds the front extremity of the groove 153. That is, the slide portion 51 starts to move rearwards relative to the bottom plate 10. Also referring to FIGS. 8 and 9, the stopping wall 511 of the slide portion 51 moves from its position immediately adjacent to the knuckle 33 of the rear plate 30 into abutment against the front side of the knuckle 33. The stopping wall 511 rides along the front side of the knuckle 33 and gradually overcomes the resilience of the corresponding torsion spring 40.

When the stopping wall 511 reaches a point just beyond the curved bottom of the knuckle 33 (i.e., a point on the rear side of the knuckle 33), the rear plate 30 has been rotated to the open position. At this moment, the elastic plate 151 of the bottom plate 10 abuts the edge of the slide portion 51 that bounds the front extremity of the recess 513, and thereby prevents continuing rearwards movement of the slide portion 51 relative to the bottom plate 10 (i.e., prevents continuing forward movement of the holder 100), as shown in FIG. 10.

Automatic upward rotation of the rear plate 30 is thus accomplished by the above-described manual pulling out of the holder 100. Specifically, the start of the rotation of the rear plate 30 depends on the position of the restricting opening 204 along the length of the left rail 201. Thus, the restricting opening 204 should be positioned to start the rotation of the rear plate 30 after the rear plate 30 is already exposed out of the electronic device 200, so as to avoid interference of the rear plate 30 in the electronic device 200.

If the forward pulling force is released when the rear plate 30 is in the open position, the rear plate 30 rotates back to its original closed position due to resilient rebounding of the torsion spring 40. Additionally, the slide portion 51 of the actuator 50 moves forward relative to the bottom plate 10, and the stopping surface 5122 of the hook 512 abuts against the edge of the flange 10b that bounds the front extremity of the groove 153 again, due to resilient rebounding of the elastic portion 52. If the door 22 is manually pushed inward, the holder 100 moves back further inside the electronic device 200. In this process, initially, the hook 512 disengages from the restricting opening 204 due to guiding by the guiding surface 5121.

An operation of fully inserting the holder 100 into the electronic device 200 is substantially the reverse of that of pulling the holder 100 out from the electronic device 200. Thus a further detailed description of such operation is omitted from this description for brevity.

When the rear plate 30 is in the open position, the functional module 300 can be secured on the bottom plate 10 only after the front plate 20 has been manually rotated upward to the open position. When the functional module 300 is installed on the bottom plate 10, the functional module 300 is resiliently pressed by both the front and rear plates 20, 30 by reason of elastic urging of the torsion springs 40, as shown in FIGS. 11-13. In particular, the front shim 21 of the front plate 20 presses on a front end of the functional module 300, and the rear shim 31 of the rear plate 30 presses on a rear end of the functional module 300. It is understood that the manual rotating of the front plate 20 can be accomplished simultaneously during the pulling out of the holder 100 and the automatic rotation of the rear plate 30. Additionally, referring to FIG. 12, the rear plate 30 can be configured such that after the functional module 300 is placed on the bottom plate 10 and the holder 100 is pushed back into the electronic device 200 slightly, the knuckle 33 becomes spaced from the front side of the stopping wall 511 of the actuator 50 a distance. In this position, the rear plate 30 clasps the rear end of the functional module 300 (via the rear shim 31) due to urging of the torsion spring 40, with the resilience of the torsion spring 40 being totally exerted on the functional module 300. With such mechanism, the stability of the functional module 300 secured on the bottom plate 10 is improved.

Furthermore, when the holder 100 is not in use, the holder 100 is thinner than the functional module 300. Therefore, the electronic device 200 having such holder 100 is smaller in size than a conventional electronic device which needs to have the functional module 300 totally received therein.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A holder for securing a functional module in an electronic device, the electronic device comprising a housing, the housing having a pair of rails on which the holder is assembled, a first baffle tab being formed on one of the rails, the holder comprising:
    a bottom plate for supporting the functional module;
    a front plate pivotally secured on a front end of the bottom plate, the front plate being elastically biased to rotate about the bottom plate for exerting pressure on the functional module; and
    a rear plate pivotally secured on a rear portion of the bottom plate, the rear plate being elastically biased to rotate about the bottom plate for exerting pressure on the functional module;
    wherein a plurality of connecting plates are formed on the front end and the rear portion of the bottom plate, a hole being defined in each of the connecting plates, and a plurality of pivot pins are formed on the front and the rear plates and received in the holes respectively such that each of the front and the rear plates is pivotally connected to the bottom plate; and
    wherein a torsion spring is accommodated on each of the front and the rear plates for providing resilience for the front and the rear plates to rotate about the bottom plate for exerting pressure on the functional module.

2. The holder of claim 1, further comprising an actuator secured on the bottom plate for automatically rotating the rear plate to an open position when the holder is almost totally slid out from the electronic device, the actuator comprising a slide portion and an elastic portion, wherein when the holder is totally received in the electronic device, the slide portion is restricted by the bottom plate, and the elastic portion resiliently abuts against the first baffle tab of the electronic device.

3. The holder of claim 2, wherein a second baffle tab is formed at a rear end of the bottom plate, and when the holder is slid partially out from the electronic device, the elastic portion is separated from the first baffle tab of the electronic device and resiliently abuts against the second baffle tab.

4. The holder of claim 2, wherein a stopping wall is formed on the slide portion, and a knuckle is formed on the rear plate, and when the holder is manually pulled partially out from the electronic device, the stopping wall rides along the knuckle and reaches a point just beyond a curved bottom of the knuckle to accomplish automatic upward rotation of the rear plate.

5. The holder of claim 4, wherein the actuator further comprises a hook extending from the slide portion, the bottom plate defines a groove therein, and the hook is engagingly received in the groove to prevent forward movement of the slide portion of the actuator relative to the bottom plate.

6. The holder of claim 4, wherein a recess is defined in the slide portion, and an elastic plate is formed on the bottom plate, the elastic plate abutting against a part of the slide portion that bounds a front extremity of the recess to prevent backwards movement of the slide portion of the actuator relative to the bottom plate.

7. The holder of claim 1, wherein a door is formed on the front plate, and a U-shaped clasp is formed on the door, and when the holder is totally received in the electronic device, the door is exposed to an outside of the electronic device, and the U-shaped clasp is engaged with one of the rails to secure the holder in the electronic device.

8. The holder of claim 1, wherein a shim is attached on an underside of each of the front and rear plates.

9. The holder of claim 1, wherein a plurality of spring fingers are formed on the bottom plate for resiliently contacting the electronic device to suppress electromagnetic interference.

10. An electronic device comprising:
a housing;
a left rail and a right rail assembled in the housing; and
a holder slidably assembled on the left and the right rails, the holder being slidable along the rails out from the housing for securing a functional module thereon, the holder comprising:
  a bottom plate for supporting the functional module, the bottom plate slidingly assembled on the left and the right rails;
  a front plate pivotally secured on a front end of the bottom plate, the front plate being elastically biased to rotate about the bottom plate in a downward direction; and
  a rear plate pivotally secured on a rear portion of the bottom plate, the rear plate being elastically biased to rotate about the bottom plate in a downward direction;
  wherein when the holder is received in the housing, the front and the rear plates are elastically biased to be oriented in unused positions substantially parallel to the bottom plate, and when the holder is almost totally slid out from the housing, the front and the rear plates are rotatable about the bottom plate to reach open positions, and in the open positions the functional module is receivable on the bottom plate and the front and the rear plates provide resilience for exerting pressure on the functional module to secure the functional module in position on the bottom plate;
wherein the holder further comprises an actuator secured on the bottom plate for automatically rotating the rear plate to the open position when the holder is almost totally pulled out from the housing, the actuator comprising a slide portion and an elastic portion, when the holder is at least partially received in the housing, the slide portion is restricted by the bottom plate.

11. The electronic device of claim 10, wherein a first baffle tab is formed on the left rail, and a second baffle tab is formed on the bottom plate and not aligned with the first baffle tab, when the holder is totally received in the housing, the elastic portion resiliently abuts against the first baffle tab, and when the holder is at least partially slid out from the housing, the elastic portion resiliently abuts against the second baffle tab.

12. The electronic device of claim 10, wherein the bottom plate comprises a main body and a flange extending from a lateral side of the main body and adjacent to the left rail, the front and the rear plates being connected to the main body, the flange defining a groove therein, the actuator further comprising a hook extending from the slide portion and abutting against an edge of the flange that bounds a front extremity of the groove.

13. The electronic device of claim 12, wherein a stopping wall is formed on the slide portion, and a knuckle is formed on the rear plate, and when the holder is almost totally slid out from the housing, the hook separates from the edge of the flange that bounds the front extremity of the groove and is restricted by the left rail, making the stopping wall ride along the knuckle and reach a point just beyond a curved bottom of the knuckle to thereby accomplish automatic upward rotation of the rear plate.

14. The electronic device of claim 13, wherein a restricting opening is defined in the left rail for engagingly receiving the hook when the holder is almost totally slid out from the housing.

15. The electronic device of claim 13, wherein a recess is defined in the slide portion, and an elastic plate is formed on the bottom plate, the elastic plate abutting against a part of the slide portion that bounds a front extremity of the recess to prevent continuing movement of the stopping wall relative to the knuckle after the stopping wall reaching the curved bottom of the knuckle.

16. The electronic device of claim 12, wherein the bottom plate further comprising a horizontal positioning plate extending from the flange and a vertical positioning plate extending from the main body for securing the actuator.

17. The electronic device of claim 10, wherein a door is formed on the front plate, and a notch is defined in the right rail, the door having a U-shaped clasp engagingly received in the notch for securing the holder in the housing.

18. A holder for securing a functional module in an electronic device, the electronic device comprising a housing, the housing having a pair of rails on which the holder is assembled, a first baffle tab being formed on one of the rails, the holder comprising:
  a bottom plate for supporting the functional module;
  a front plate pivotally secured on a front end of the bottom plate, the front plate being elastically biased to rotate about the bottom plate for exerting pressure on the functional module;
  a rear plate pivotally secured on a rear portion of the bottom plate, the rear plate being elastically biased to rotate about the bottom plate for exerting pressure on the functional module; and
  an actuator secured on the bottom plate for automatically rotating the rear plate to an open position when the holder is almost totally slid out from the electronic device, the actuator comprising a slide portion and an elastic portion, wherein when the holder is totally received in the electronic device, the slide portion is restricted by the bottom plate, and the elastic portion resiliently abuts against the first baffle tab of the electronic device.

19. The holder of claim 18, wherein a second baffle tab is formed at a rear end of the bottom plate, and when the holder is slid partially out from the electronic device, the elastic portion is separated from the first baffle tab of the electronic device and resiliently abuts against the second baffle tab.

20. The holder of claim 18, wherein a stopping wall is formed on the slide portion, and a knuckle is formed on the rear plate, and when the holder is manually pulled partially out from the electronic device, the stopping wall rides along the knuckle and reaches a point just beyond a curved bottom of the knuckle to accomplish automatic upward rotation of the rear plate.

* * * * *